United States Patent
Kanno

(10) Patent No.: US 10,083,845 B2
(45) Date of Patent: Sep. 25, 2018

(54) SUBSTRATE PROCESSING APPARATUS, SUBSTRATE PROCESSING METHOD AND STORAGE MEDIUM

(71) Applicant: Tokyo Electron Limited, Tokyo (JP)

(72) Inventor: Itaru Kanno, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 220 days.

(21) Appl. No.: 15/005,415

(22) Filed: Jan. 25, 2016

(65) Prior Publication Data
US 2016/0225682 A1  Aug. 4, 2016

(30) Foreign Application Priority Data
Feb. 3, 2015  (JP) ................... 2015-019049

(51) Int. Cl.
*H01L 21/67* (2006.01)
*H01L 21/02* (2006.01)
*H01L 21/66* (2006.01)

(52) U.S. Cl.
CPC .... *H01L 21/6708* (2013.01); *H01L 21/02052* (2013.01); *H01L 21/02057* (2013.01); *H01L 21/67051* (2013.01); *H01L 21/67253* (2013.01); *H01L 21/67115* (2013.01); *H01L 22/12* (2013.01)

(58) Field of Classification Search
CPC ......... H01L 21/02041; H01L 21/02052; H01L 21/02054; H01L 21/6708; H01L 21/67051; H01L 21/67253
See application file for complete search history.

(56) References Cited

U.S. PATENT DOCUMENTS

| 5,722,441 A * | 3/1998 | Teramoto ............. B08B 3/10 134/113 |
| 2003/0066548 A1* | 4/2003 | Chopra ............... B08B 3/00 134/34 |
| 2006/0046413 A1* | 3/2006 | Edamoto .......... H01L 21/67051 438/366 |

FOREIGN PATENT DOCUMENTS

JP   2009-218402 A   9/2009

OTHER PUBLICATIONS

JP2009218402—Machine Translation (Year: 2009).*

* cited by examiner

*Primary Examiner* — Marc Lorenzi
(74) *Attorney, Agent, or Firm* — Abelman, Frayne & Schawb

(57) ABSTRACT

Provided is a substrate processing apparatus, in which a processing liquid is supplied to a substrate W held horizontally by a substrate holding unit. A processing liquid passing portion includes a passing surface that is provided between the substrate W and a recovery cup provided around the substrate W such that the processing liquid flows on the passing surface. Light for concentration detection is projected from a light projection unit to the passing surface, and a concentration detection unit detects a concentration of the processing liquid based on a result of receiving the reflected light of the light by a light receiving unit.

15 Claims, 11 Drawing Sheets

FIG.5
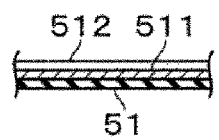
FIG.6
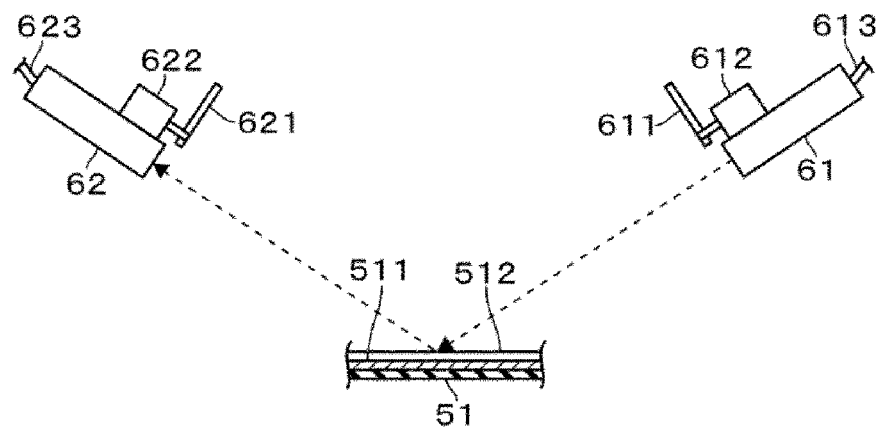

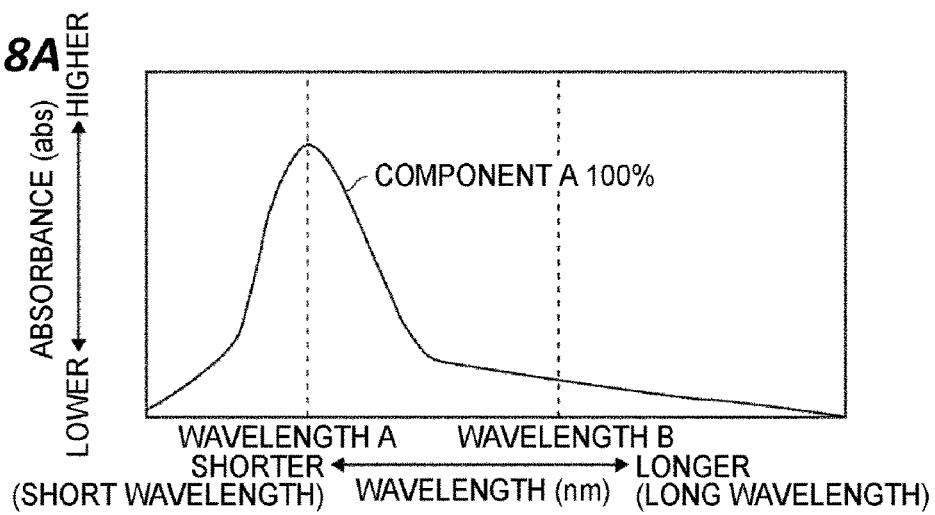
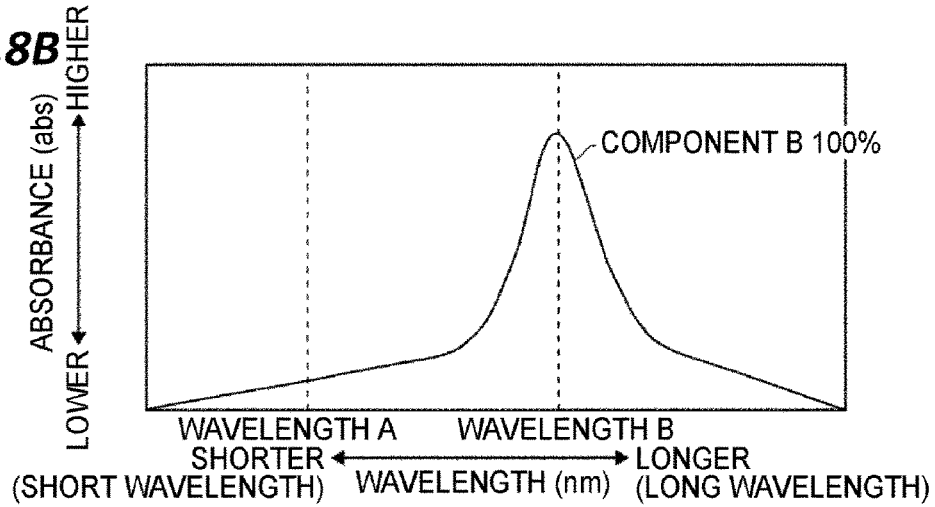
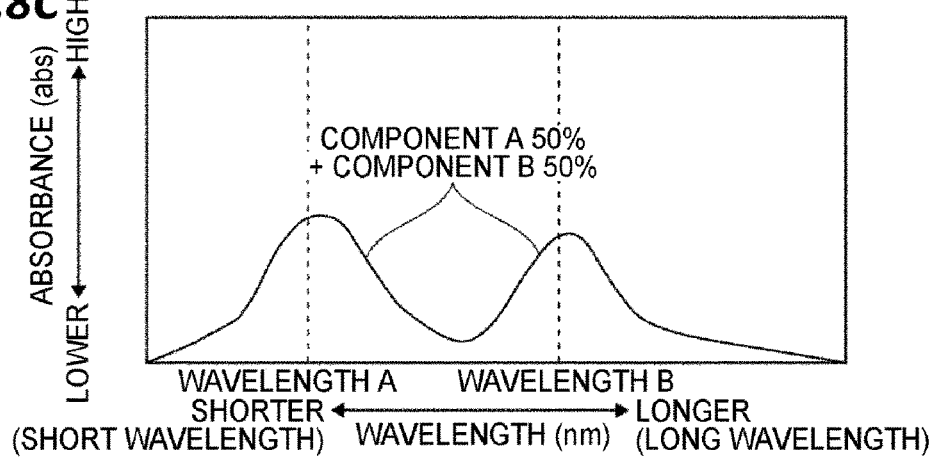

SUBSTRATE PROCESSING APPARATUS, SUBSTRATE PROCESSING METHOD AND STORAGE MEDIUM

CROSS-REFERENCE TO RELATED APPLICATIONS

This application is based on and claims priority from Japanese Patent Application No. 2015-019049, filed on Feb. 3, 2015, with the Japan Patent Office, the disclosure of which is incorporated herein in its entirety by reference.

TECHNICAL FIELD

The present disclosure relates to a technology of performing a processing of a substrate by supplying different kinds of processing liquids to the substrate.

BACKGROUND

A process of performing a processing of a substrate such as, for example, a semiconductor wafer (hereinafter, referred to as a "wafer"), by supplying a processing liquid to the substrate, includes sequentially switching and supplying different kinds of processing liquids. For example, when a rinse liquid such as, for example, deionized water (DIW), is supplied to a wafer to perform a rinse processing after the wafer is processed with a chemical liquid, or when highly volatile isopropyl alcohol (IPA) is supplied to dry the wafer after the rinse processing, it is required to sufficiently replace the processing liquid (first processing liquid) existing on the wafer surface with a processing liquid (second processing liquid) to be supplied later.

With respect to the replacement operation of the processing liquids, it is required to determine whether the processing liquid (first processing liquid) existing on the wafer surface is replaced with the processing liquid (second processing liquid) to be supplied later, in view of consumption amounts of the processing liquids or processing time. For example, Japanese Patent Laid-Open Publication No. 2009-218402 (paragraphs [0028] to [0031] and FIG. 1) discloses a technology in which when DIW (rinse liquid) supplied to a rotating wafer is replaced with IPA, it is detected whether the DIW is replaced with the IPA, by making a prism in contact with a liquid surface of the IPA formed on the surface of the wafer to cause light emitted from the prism to pass through the IPA, be reflected, and be received, and calculating a water concentration based on attenuation of a predetermined wavelength component.

SUMMARY

A substrate processing apparatus of the present disclosure includes: a substrate holding unit that is configured to hold a substrate horizontally; a first processing liquid supply unit that is configured to supply a first processing liquid to a substrate held by the substrate holding unit; a recovery cup that is provided around the substrate held by the substrate holding unit, and configured to receive the first processing liquid after the first processing liquid is supplied to the substrate; a processing liquid flowing portion that includes a passing surface that is provided between the substrate held by the substrate holding unit and the recovery cup such that the first processing liquid flowing out from the substrate flows on the passing surface; and a concentration detection unit that includes a light projection unit configured to project light for concentration detection to the passing surface and a light reception unit configured to receive light reflected on the passing surface. The concentration detection unit is configured to detect a concentration of the first processing liquid, based on information obtained from the light reception unit.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 5 is an enlarged side view of a light projection unit and a light reception unit when they are not in use.

FIG. 6 is an enlarged side view of the light projection unit and the light reception unit when they are in use.

FIGS. 8A to 8C are schematic views illustrating an exemplary absorbance distribution detected in the concentration detection unit.

DETAILED DESCRIPTION

Figure 1:
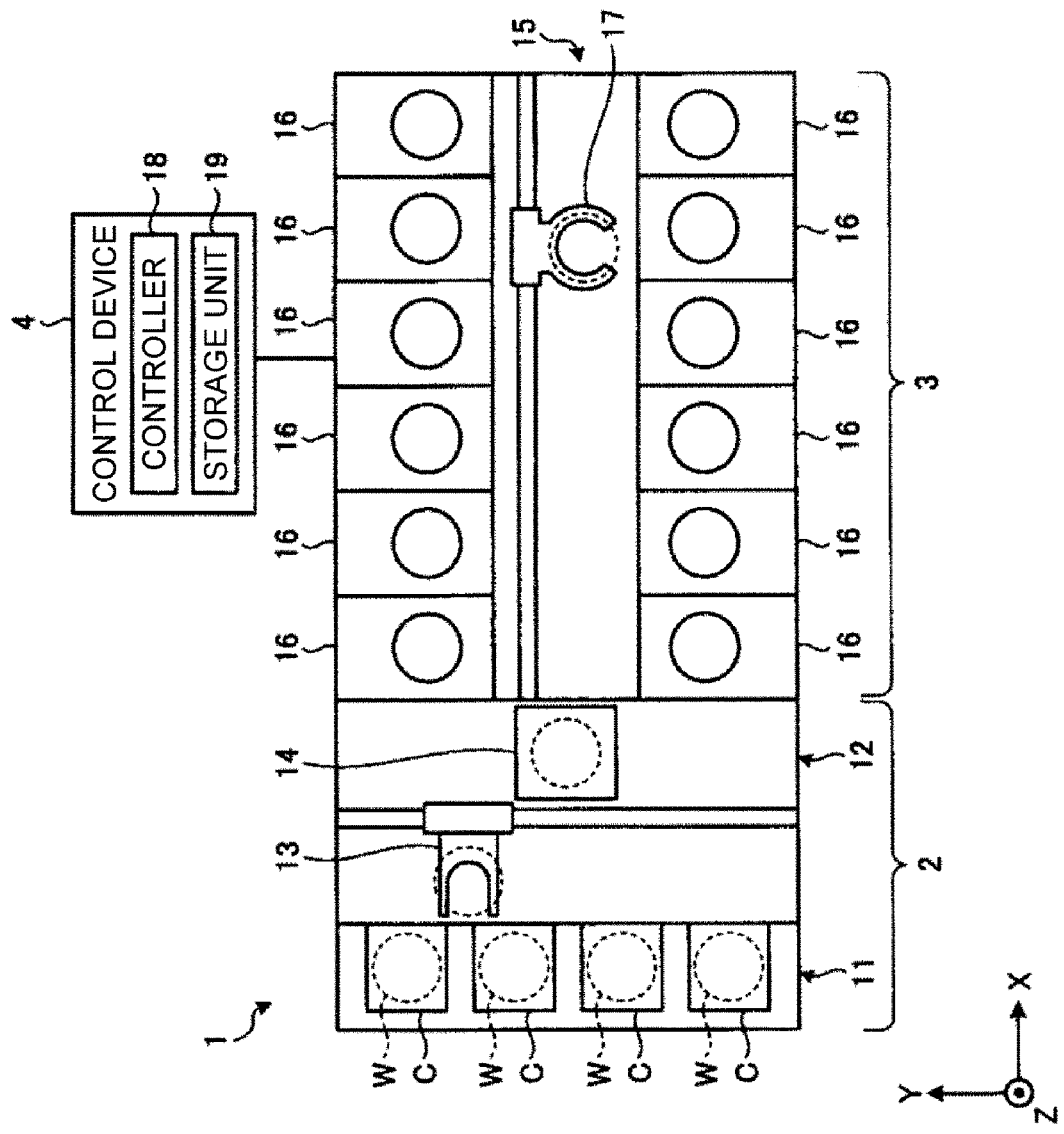
FIG. 1 is a plan view illustrating an outline of a substrate processing system including processing units according to a first exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

According to the technology disclosed in Japanese Patent Laid-Open Publication No. 2009-218402, a water concentration in the IPA on the wafer surface is detected, and a timing to stop the IPA is determined based on the detection result.

However, bending may happen in the wafer in some cases, and thus, when a reflection position of light changes, accurate concentration detection may not be performed. Further, irregular reflection of light caused by patterns formed on the surface of the wafer also becomes a factor that disturbs the accurate concentration detection. Further, the act of contacting the prism with the liquid surface of the processing liquid may cause contamination of the wafer.

The present disclosure provides a technology that is able to accurately detect a processing liquid concentration during a substrate processing with a processing liquid.

A substrate processing apparatus of the present disclosure includes: a substrate holding unit that is configured to hold a substrate horizontally; a first processing liquid supply unit that is configured to supply a first processing liquid to a substrate held by the substrate holding unit; a recovery cup that is provided around the substrate held by the substrate holding unit, and configured to receive the first processing liquid after the first processing liquid is supplied to the substrate; a processing liquid flowing portion that includes a passing surface that is provided between the substrate held by the substrate holding unit and the recovery cup such that the first processing liquid flowing out from the substrate flows on the passing surface; and a concentration detection unit that includes a light projection unit configured to project light for concentration detection to the passing surface and a light reception unit configured to receive light reflected on the passing surface. The concentration detection unit is configured to detect a concentration of the first processing liquid, based on information obtained from the light reception unit.

This substrate processing apparatus may include the following configurations:

(a) The concentration detection unit includes a plurality of light projection units, a light source configured to supply light for concentration detection to the plurality of the light projection units, and a switching unit configured to switch the light for concentration detection supplied from the light source to each of the light projection units. The substrate processing apparatus further includes a controller configured to perform a control to stop the supply of the first processing liquid, based on the concentration detected by the concentration detection unit.

(b) The substrate processing apparatus further includes: a second processing liquid supply unit configured to supply a second processing liquid to the substrate; and a controller configured to perform a control to supply the second processing liquid to the substrate from the second processing liquid supply unit after the first processing liquid is supplied thereto. The controller determines whether the first processing liquid on the surface of the substrate is replaced with the second processing liquid, based on the concentration detected by the concentration detection unit. The concentration detection unit detects the concentration of the first processing liquid and/or the concentration of the second processing liquid while the second processing liquid is supplied.

(c) The substrate processing apparatus of claim 1, further comprising a rotation driving mechanism configured to rotate the substrate holding unit around a vertical axis, and the processing liquid flowing portion is provided such that the passing surface surrounds the substrate held by the substrate holding unit. In this case, the processing liquid flowing portion is provided in the substrate holding unit, and rotated together with the substrate held by the substrate holding unit. Alternatively, The substrate processing apparatus further includes a rotation driving mechanism configured to rotate the substrate holding unit around a vertical axis, and the processing liquid flowing portion is fixedly provided such that the passing surface is placed at an outer peripheral side of the substrate held and rotated on the substrate holding unit.

(d) The controller performs a control to stop the supply of the second processing liquid from the second processing liquid supply unit when the concentration of the first processing liquid becomes a predetermined threshold value or less. Further, the controller stores a supply time of the second processing liquid when the concentration of the first processing liquid becomes the preset threshold value or less, and sets the stored time as a supply time of the second processing liquid when a next substrate is processed. In addition, the substrate processing apparatus further includes an alarm notification unit configured to notify an alarm when the concentration of the first processing liquid detected by the optical concentration detection unit is higher than a preset alarm notification value. The controller causes the alarm notification unit to notify an alarm when the concentration of the first processing liquid does not become the alarm notification value or less after lapse of a preset time.

(e) A reflection member is provided on the passing surface to reflect the light for concentration detection. At least one of the first processing liquid and the second processing liquid has corrosiveness, and the reflection member is formed of a metal material and has a surface covered with a protection member that transmits the light for concentration detection and suppresses corrosion of the reflection member.

(f) The recovery cup is configured to attach the light projection unit and the light reception unit thereto. The light projection unit and the light reception unit are provided at a location higher than the substrate held by the substrate holding unit.

The substrate processing method of the present disclosure includes: supplying a first processing liquid to a substrate held by a substrate holding unit from a first processing liquid supply unit; receiving the first processing liquid after the first processing liquid is supplied to the substrate, by a recovery cup provided around the substrate held by the substrate holding unit; causing the first processing liquid flowing out from the substrate to flow on a passing surface of a processing liquid flowing portion provided between the substrate held by the substrate holding unit and the recovery cup; projecting light for concentration detection to the passing surface from a light projection unit; receiving light reflected on the passing surface by a light reception unit; and detecting a concentration of the first processing liquid by a concentration detection unit, based on information obtained from the light reception unit.

The above-described substrate processing method further includes supplying a second processing liquid to the substrate from a second processing liquid supply unit after the first processing liquid processing is supplied, and determining whether the first processing liquid on the surface of the substrate is replaced with the second processing liquid, based on the concentration detected by the concentration detection unit.

In the above-described substrate processing method, the detecting of the concentration includes detecting the concentration of the first processing liquid in the second processing liquid flowing on the passing surface, and notifying an alarm from an alarm notification unit, when the concentration of the first processing liquid is higher than a preset alarm notification value, even after a preset time is lapsed.

The present disclosure provides a non-transitory computer readable storage medium that stores a computer program used in a substrate processing apparatus that performs a processing of a substrate by supplying a first processing liquid or a second processing liquid to the substrate held horizontally by a substrate holding unit. In the computer program, steps are organized to execute the above-described substrate processing method.

The present disclosure is capable of accurately detecting a concentration of a processing liquid during a processing of a substrate with the processing liquid, without being affected by patterns formed on the substrate or bending of the substrate.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a controller 18 and a storage unit 19. The storage unit 19 stores a program that controls various processings performed in the substrate processing system 1. The controller 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
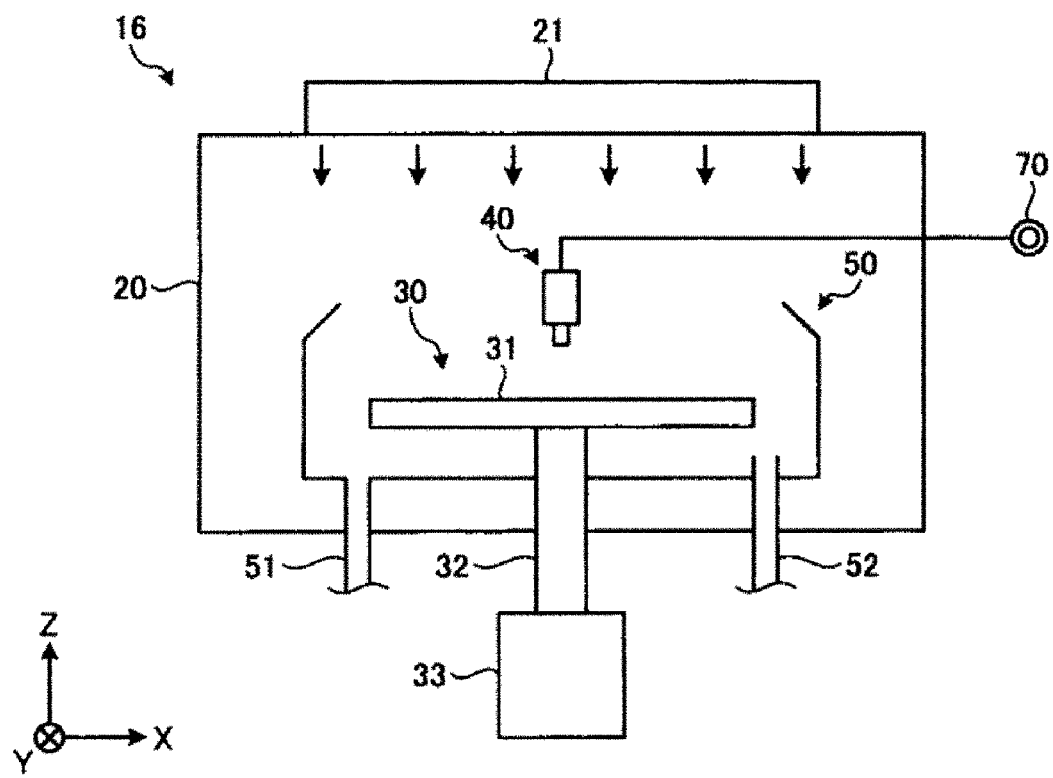
FIG. 2 is a vertical sectional side view illustrating an outline of a processing unit.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside of the processing unit 16.

In the substrate processing system 1, which is the substrate processing apparatus according to the present exemplary embodiment, a plurality of kinds of processing liquids (e.g., a chemical liquid, a rinse liquid, and IPA) are switched and supplied as processing fluids from the processing fluid supply unit 40 of each of the processing units 16. In each of the processing units 16, the concentration of the processing liquid supplied to the wafer W may be detected by using an optical concentration detection unit.

Hereinafter, descriptions will be made on a method for detecting the concentration of the processing liquid with reference to FIGS. 3 to 8C.

Figure 3:
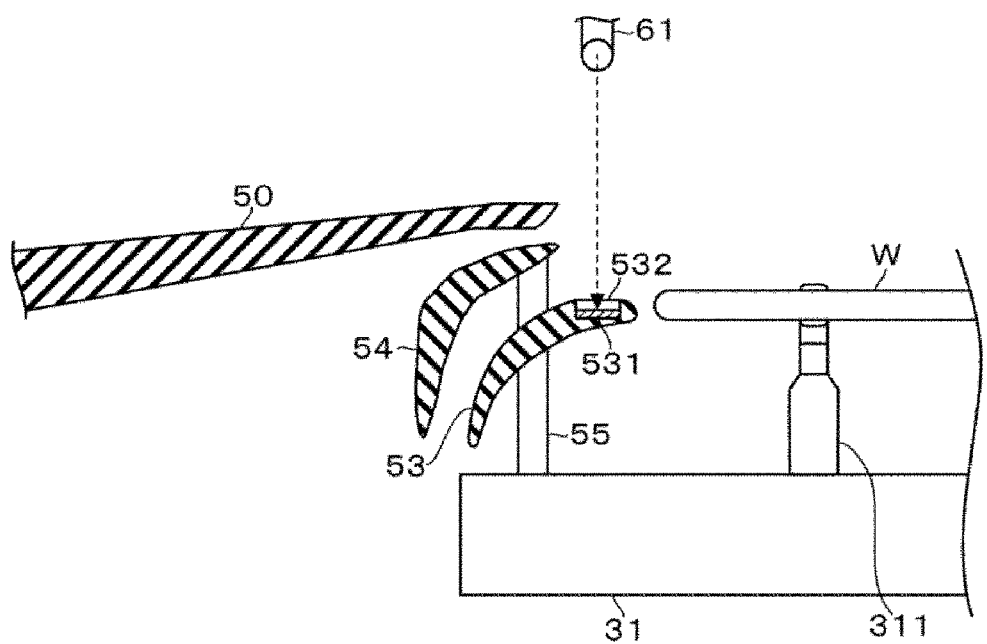
FIG. 3 is an enlarged vertical sectional side view of the processing unit including a concentration detection unit of a processing liquid.
Figure 4:
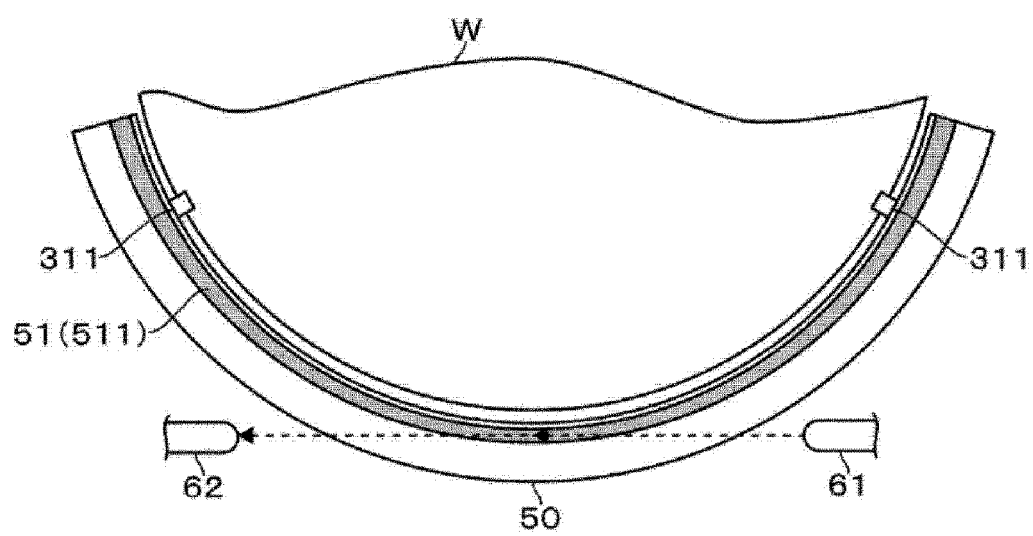
FIG. 4 is an enlarged plan view of the processing unit.

FIGS. 3 and 4 are an enlarged vertical sectional side view and an enlarged plan view of the circumferential edge of the holding unit (substrate holding unit) 31 configured to hold the wafer W in the processing unit 16 illustrated in FIG. 2, respectively.

As illustrated in FIGS. 3 and 4, a plurality of support pins 311 are provided in the circumferential edge of the top surface of the holding unit 31 to support a wafer W. The wafer W is supported by the support pins 311 and a processing is performed at a position of a height that forms a gap from the top surface of the holding unit 31.

At a side of the wafer W supported by the support pins 311A, a rotary ring 53 is provided on the holding unit 31 to guide a processing liquid flowing out from the wafer W. The rotary ring 53 is an annular member when viewed from the top side of the rotary ring 53, and is placed to surround the wafer W with a gap of about 0.5 mm to about 5 mm from the circumferential side surface of the wafer W. In other words, the rotary ring 53 is provided between the wafer W supported by the holding unit 31 and the recovery cup 50.

As illustrated in the vertical sectional side view of FIG. 3, an inclined surface is formed on each of the top surface and the bottom surface of the rotatory ring 53. A height position of the inclined surface becomes gradually lower from the inside position of the rotary ring 53 that faces the circumferential side surface of the wafer W, toward the outside position of the rotary ring 53, in which the recovery cup 50 is provided.

Further, a rotary cup 54, which is an annular member, is provided above the rotary ring 53 to guide, together with the rotary ring 53, the processing liquid flowing out from the wafer W or gas supplied from the FFU 21 toward the recovery cup 50. The rotary cup 54 is provided at a position that forms a gap from the top surface of the rotary ring 53, so as to cover the rotary ring 53 from the upper side of the rotary ring 53. Like the rotary ring 53, an inclined surface is formed on the bottom surface of the rotary cup 54. A height position of the inclined surface becomes gradually lower from the inside toward the outside.

The above-described rotary ring 53 and rotary cup 54 are supported by a plurality of support members 55 that are provided to extend upwardly from the top surface of the holding unit 31, and arranged to be spaced apart from each other along the circumferential direction of the holding unit 31.

By this configuration, various kinds of processing liquids are supplied from the processing fluid supply unit 40 to the rotating wafer W, and then, spread over the surface of the wafer W to flow out from the circumferential edge of the wafer W outwardly. Further, the above-described rotary ring 53 is provided at the position where the processing liquids flow out, so that the processing liquids flowing out from the wafer W flow over the top surface of the rotary ring 53, pass through the gap between the rotary ring 53 and the rotary cup 54, and then, are discharged toward the recovery cup 50.

In the processing unit 16 according to the present exemplary embodiment, in consideration of the fact that the processing liquid flows immediately after flowing out from the wafer W and the placement height of the rotary ring 53 is fixed unlike the wafer W that is bent, the detection of the concentration of a processing liquid is performed by using the rotary ring 53.

Specifically, as illustrated in FIGS. 3 and 4, the inner peripheral ends of the top surface portions of the rotary cup 54 and the recovery cup 50, which are placed above the rotary ring 53, are placed outside the inner peripheral end of the rotary ring 53. Accordingly, in the processing unit 16 of the present exemplary embodiment, the inner peripheral end of the rotary ring 53, which is the area where the processing liquid passes immediately after flowing from the wafer W is exposed when viewed from the top side of the recovery cup 50. Hereinafter, the area is also referred to as a "passing surface."

Therefore, the concentrations of the processing liquids may be detected by irradiating light for concentration detection of the processing liquids toward the passing surface, and receiving the reflected light thereof.

The processing unit 16 of the present disclosure is provided with an optical concentration detection unit configured to perform the concentration detection of the processing liquid, and uses the above-described rotary ring 53 as an area where the concentration of the processing liquid is detected by the optical concentration detection unit.

In order to form a surface state suitable for the optical concentration detection, the rotary ring 53 of the present exemplary embodiment is provided with a reflection member 531. In order to perform the optical concentration detection, the light projected to the above-described area is required to be sufficiently reflected. Accordingly, a groove is formed on the passing surface of the processing liquid along the circumferential direction of the rotary ring 53, and the reflection member 531 is embedded in the groove to facilitate the reflection of the light. The reflection member 531 is formed of an annular metal member. In FIG. 4, the area where the reflection member 531 is placed is colored to gray.

Meanwhile, as described later, a chemical liquid to be supplied as a processing liquid to the wafer W may include a corrosive material that corrodes a metal such as, for example, a hydrofluoric acid or ammonia. Accordingly, a protection member 532 is provided within the groove of the top surface side of the reflection member 531. The protection member 532 is an annular member formed of a material that transmits the light for concentration detection and has a corrosion resistance against the corrosive material such as, for example, quartz or a transparent resin. The top surface of the protection member 532 is flush with the top surface of the other area of the rotary ring 53, and is formed with a smooth surface to not obstruct the passing of the processing liquid.

Next, descriptions will be made on the configuration of the optical concentration detection unit that performs the concentration detection of the processing liquid. As illustrated in the block diagram of FIG. 7, the optical concentration detection unit includes: a light projection unit 61 configured to project light for concentration detection toward the rotary ring 53, a light reception unit 53 configured to receive the light reflected on the rotary ring 53, and a concentration calculation unit 604 configured to calculate the concentration of the processing liquid based on the absorbance of a predetermined wavelength component included in the light received by the light reception unit 62.

Figure 7:
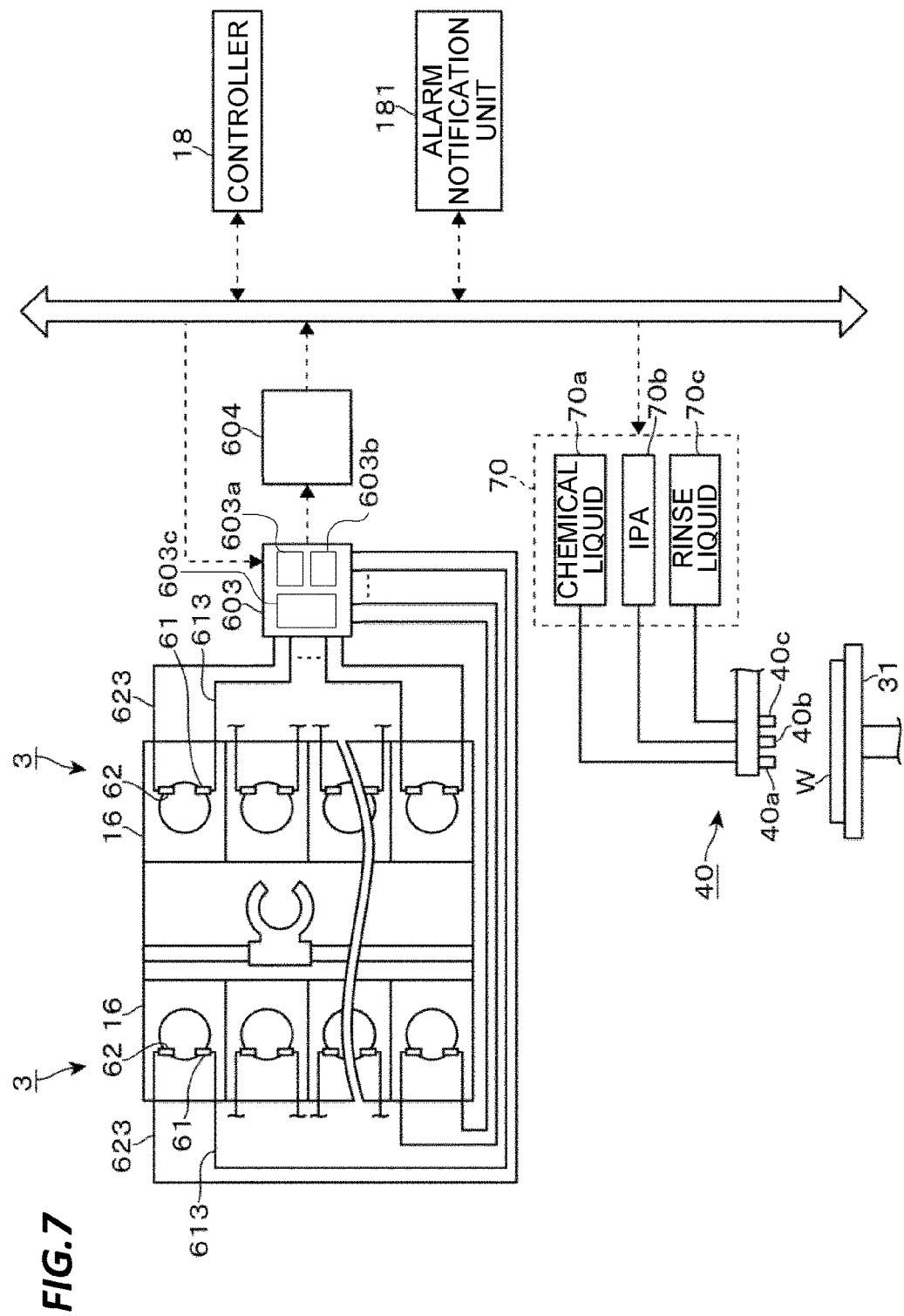
FIG. 7 is a block diagram of the substrate processing system including a concentration detection unit.

As illustrated in the block diagram of FIG. 7, the light projection unit 61 and the light reception unit 62 are provided in each of the plurality of the processing units 16, in the substrate processing system 1 of the present exemplary embodiment. Meanwhile, for example, one concentration calculation unit 604 is provided to be shared by the processing units 16. The light projection unit 61 and the light reception unit 62 of each of the processing units 16 are connected to an optical signal processing unit 603 through optical fibers 613 and 623, respectively. The optical signal processing unit 603 is connected to the concentration calculation unit 604. Instead of the example illustrated in FIG. 7, one optical signal processing unit 603 may be provided per one pair of the light projection unit 61 and the light reception unit 62 provided in each of the processing units 16, and the optical signal processing units 603 may be connected to the one common concentration calculation unit 604.

The optical signal processing unit 603 includes: a light source 603a configured to generate light for concentration detection, a light processing unit 603b configured to receive the light and perform a signal processing of the light, and a switching member 603c configured to supply the light generated by the light source to the light projection unit 61 of the predetermined processing unit 16 via the optical fiber 613 connected to the plurality of the light projection units 61.

The concentration calculation unit 604 calculates the concentration of the processing liquid based on a signal output from the optical signal processing unit 603. Here, the switching operation of the switching unit 603c is performed by a control signal from the controller 18. Further, with respect to the light introduced to the light processing unit 603b and the concentration calculated by the concentration calculation unit 604, the controller 18 determines which of the processing units 16 performs the concentration detection.

As illustrated in FIGS. 4 to 6, within the chamber 20 of the processing unit 16, the light projection unit 61 is placed at a position where the light for concentration detection is projected toward the passing surface of the rotary ring 53, which is the area where the reflection member 531 is provided, and the light reception unit 62 is arranged at a position on which the light reflected on the passing surface is incident. In this way, the light projection unit 61 and the light reception unit 62 are arranged above the wafer W held on the holding unit 31. For example, the recovery cup 50 is provided with an attachment member (not illustrated) that is capable of attaching the light projection unit 61 and the light reception unit 62 thereto.

As illustrated in FIGS. 5 and 6, the light projection unit 61 and the light reception unit 62 are provided with opening/closing type shutters 611 and 621, respectively, in order to suppress the processing liquid supplied to the wafer W from being adhered to the light projection surface or the light reception surface. The shutters 611 and 621 are rotated by driving units 612 and 622, respectively, and move between a position to cover the light projection surface and the light reception surface (FIG. 5), and a position to expose the light projection surface and the light reception surface (FIG. 6). The detection of the concentration of the processing liquid is performed in the state that the light projection surface and the light reception surface are exposed. The drawings other than FIGS. 5 and 6 omit the shutters 611 and 621.

The light for concentration detection that is supplied from the light signal processing unit 603 is input to the light projection unit 61 through the optical fiber 613, and projected to the rotary ring 53 through a lens provided on the light projection surface of the light projection unit 61 (not illustrated). The light projection unit 61 is fixed to a position where the light projection unit 61 does not interfere with the carry-in/out operation of the wafer W or the movement operation of the processing fluid supply unit 40 at the time of supplying the processing liquid. The projection position of the light for concentration detection does not move.

For example, infrared light is used as the light to be projected from the light projection unit 61, and the light to be projected from the light projection unit 61 has a spectrum distribution, in which infrared light having a wavelength, which is specifically absorbed to a detecting target component contained in the processing liquid, is mixed.

The light reception unit 62 is fixed to the position on which the light for concentration detection reflected on the rotary ring 53 is incident, and includes a lens on which the reflected light is incident. The light received by the light reception unit 62 is introduced into the optical signal processing unit 603 through the optical fiber 623.

The light received through the light reception unit 62 of each of the processing units 16 is subjected to a signal processing within the optical signal processing unit 603. The processed information is input to the concentration calculation unit 604 so as to calculate the concentration. As a result, the concentration detection of the processing liquid is performed for the wafer W within the processing units 16.

Here, with reference to FIGS. 8A to 8C, descriptions will be made, assuming an example in which a first processing liquid that contains a component A and has already been supplied to the wafer W is replaced with a second processing liquid that contains a component B. In FIGS. 8A to 8C, the horizontal axes represents an absorption wavelength (nm) of each of the components, and the vertical axes represents absorbance (abs).

As schematically illustrated in FIGS. 8A and 8B, a liquid has an intrinsic wavelength that is easily absorbed by a component of the liquid (e.g., a near-infrared wavelength). Accordingly, when infrared light is projected to the concentration detection target component A and the absorbance of the reflected light of the infrared light is measured, the absorbance of the wavelength A increases (FIG. 8A). For the component B, the absorbance of the wavelength B increases (FIG. 8B). For a mixed solution of the components A and B, the absorbance of each of the wavelengths varies in correspondence with the concentration of each of the components, as illustrated in FIG. 8C, and hence, the concentration of each of the components may be grasped by measuring the absorbance of the wavelengths.

Based on this principle, the concentration calculation unit 604 calculates the concentration of the first processing liquid and the concentration of the second processing liquid in the processing liquids flowing on the rotary ring 53. Here, in order to offset the influence by the thickness variation of the processing liquids at the position where the light for concentration detection is projected/reflected, the concentration calculation unit 604 calculates the concentration of the first processing liquid in the second processing liquid, based on a ratio between the absorbance of the wavelength A and the absorbance of the wavelength B.

FIGS. 8A to 8C are virtual absorbance distributions, which are prepared to facilitate understanding of the exemplary concentration detection method by the optical concentration detection unit of the present exemplary embodiment, and do not mean actually detected absorbance distributions.

As illustrated in FIG. 7, the concentration calculation unit 604 is connected to the controller 18, and the concentration of a processing liquid that is calculated by the concentration calculation unit 604 is used for controlling various devices. A first example of the control using the concentration detection result of the processing liquid is control of a timing to stop supply of a chemical liquid.

For example, as illustrated in FIG. 7, the above-described fluid supply source 70 includes a chemical liquid supply unit 70a, a rinse liquid supply unit 70b, and an IPA supply unit 70c. Further, the processing fluid supply unit 40 includes a chemical liquid nozzle 40a configured to eject the chemical liquid supplied from the chemical liquid supply unit 70a to the wafer W, a rinse liquid nozzle 40b configured to eject the rinse liquid supplied from the rinse liquid supply unit 70b, and an IPA nozzle 40c configured to eject the IPA supplied from the IPA supply unit 70c.

Figure 9:
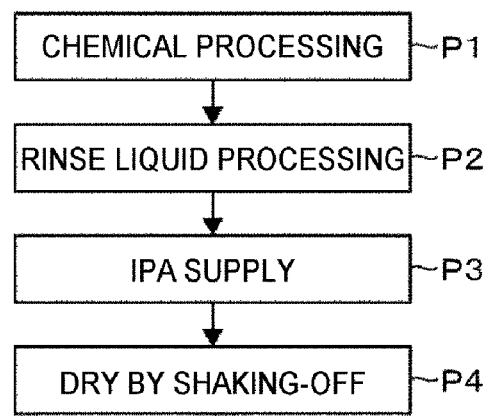
FIG. 9 is an explanatory view illustrating a flow of a substrate processing performed in the processing unit.

The controller 18 performs the operation to switch and supply the chemical liquid, the rinse liquid, and the IPA in this order as exemplified in FIG. 9, to each of the processing units 16. Specifically, the controller 18 sends a signal for performing the operation. In this case, the controller 18 performs the operation to replace the chemical liquid (first processing liquid) supplied to the wafer W with the rinse liquid (second processing liquid) or the operation to replace the rinse liquid supplied to the wafer W (first processing liquid) with the IPA (second processing liquid). In this case, the controller 18 controls a timing to stop the supply of the second processing liquid, by detecting the concentration of the first processing liquid in the second processing liquid, using the above-described optical concentration detection unit.

That is, the controller 18 performs a control to stop the supply of the second processing liquid and proceed with the subsequent process when the concentration of the first processing liquid in the second processing liquid becomes a pre-set threshold value or less as a result of the concentration detection.

Here, examples of the chemical liquid supplied from the chemical liquid supply unit 70a are SC1 (a mixed aqueous solution of ammonia water and hydrogen peroxide water) for removing organic dirt or particles, SC2 (a mixed solution of hydrochloric acid, hydrogen peroxide water, and deionized water) for removing metal contamination, and diluted hydrogen acid (DHF) for removing a natural oxide on a surface of a metal member. These acidic or alkaline chemical liquids may be corrosive materials that corrode the reflection member 531, and when the protection member 532 is provided on the top surface of the reflection member 531, the top surface of the reflection member 531 may be maintained in a state in which the light is easily reflected thereon.

In addition, from the chemical liquid supply unit 70a, a configuration to switch and supply a plurality of kinds of chemical liquids may be adopted. In this case, the processing order of the processing process illustrated in FIG. 9 is changed as follows: after a first chemical liquid processing P11 and a rinse processing P21 are performed, a second chemical liquid processing P12 and a rinse processing P22 are performed, and then, supply of the IPA P3 is performed.

Subsequently, a second example of a control using the concentration detection result of the processing liquid is management of a water concentration in the IPA.

The FFU 21 illustrated in FIG. 2 forms a downflow by, for example, dry air or nitrogen gas, and performs a control to make the water concentration in the downflow lower than a preset target value. When an error occurs in the water control, the water contained in the downflow may increase to be incorporated into the IPA supplied to the wafer W, which may cause generation of water marks.

Thus, in the operation to replace the rinse liquid (first processing liquid) supplied to the wafer W with the IPA (second processing liquid), the controller 18 performs a control to cause an alarm notification unit 181 to notify an alarm when the water concentration contained in the IPA does not become a preset alarm notification value or less, even after lapse of a preset time. The alarm may be a voice alarm, or a text alarm may be displayed on, for example, a touch panel provided in the substrate processing system 1. Further, in this case, the controller 18 may store the supply time of the IPA when the alarm is notified, and reset the stored time as the supply time of the IPA when the next wafer W is processed. In this case, the time for notification of the alarm is reset to a time obtained by adding a predetermined margin to the new supply time of the IPA.

When the concentration of the alarm notification value is set to a value lower than the above-described threshold value for determining the replacement between the rinse liquid and the IPA, the supply of the IPA is stopped prior to the alarm notification, so that the condition for the alarm notification is not established. In this case, it is desirable to provide a process of checking water in the downflow at a predetermined interval (e.g., by every predetermined number of processed sheets of wafers W or by every lapse of a predetermined time), and during this process, to adopt a sequence of waiting the lapse of a predetermined time according to the alarm notification without stopping the supply of the IPA even if the water in the IPA becomes the threshold value or less, and then stopping the supply of IPA.

Descriptions will be made on the operation of the above-described substrate processing system 1 (the processing units 16) with reference to FIGS. 9 to 11. FIG. 11 schematically illustrates a ratio of the absorbance of the wavelength A to the absorbance of the wavelength B, which is calculated in the concentration calculation unit 604, i.e., an aging change of the concentration of the first processing liquid in the second processing liquid.

A wafer W, which has been conveyed to each of the processing units 16 by the substrate transfer device 17, is carried into the chamber 20 through a carry-in/out port (not illustrated). The substrate transfer device 17 delivers the wafer W to be processed onto the support pins 311 of the holding unit 31, and then, moves backward from the inside of the chamber 20.

Thereafter, the rotation of the wafer W (the holding unit 31) is started by the driving unit 33, which is a rotation driving mechanism, and the support unit 32, and a chemical liquid is supplied from the chemical liquid nozzle 40a to the wafer W to initiate a processing (process P1 of FIG. 9). The chemical liquid supplied to the surface of the rotating wafer W is spread so that the processing of the surface is performed, and eventually, the chemical liquid reaches the circumferential edge of the wafer W.

Figure 10:
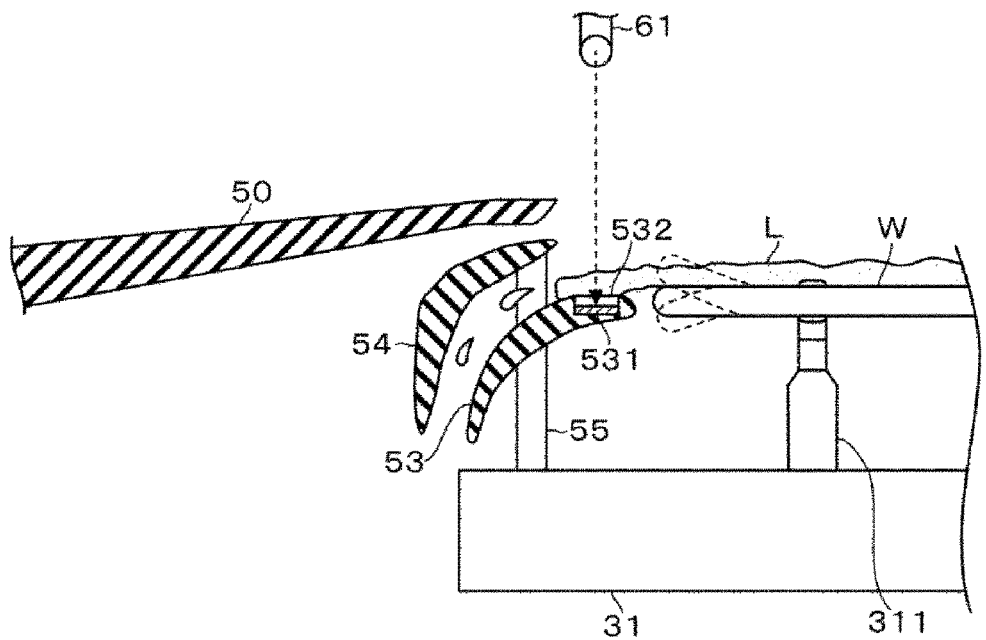
FIG. 10 is an explanatory view illustrating an operation of the processing unit.
Figure 11:
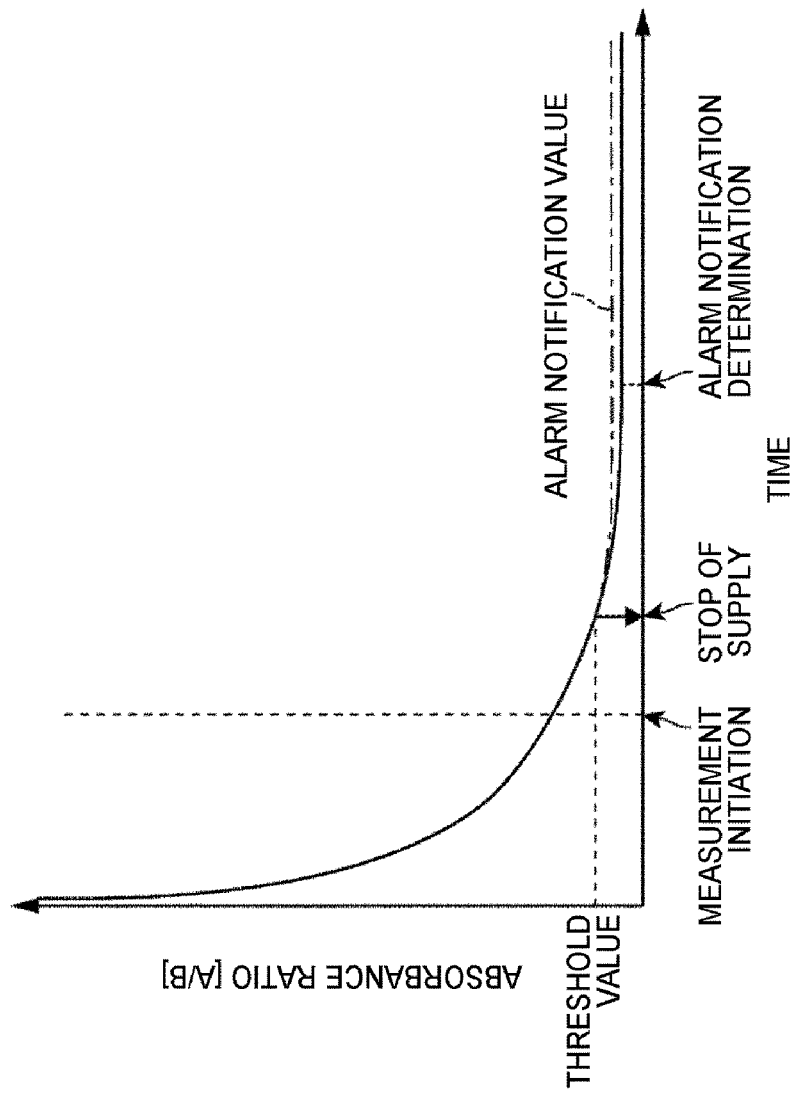
FIG. 11 is an explanatory view illustrating an aging change of a concentration of a processing liquid supplied to a wafer.

As illustrated in FIG. 10, the chemical liquid (processing liquid L) that has reached the circumferential edge of the wafer W flows on the top surface of the rotary ring 53 arranged to surround the wafer W, and then, flows into the gap between the rotary ring 53 and the rotary cup 54 to be discharged toward the recovery cup 50.

Here, a plurality of recovery cups 50 may be provided concentrically and internal recovery cups 50 may be configured to be liftable such that, when the internal recovery cups 50 are lifted depending on the kinds of processing liquids to be supplied, the chemical liquids or the rinse liquids may be received by the dedicated recovery cups 50 thereof, respectively.

When the substrate processing by a chemical liquid has been performed for a predetermined time in this way, the supply of the chemical liquid from the chemical liquid nozzle 40a is stopped, and a rinse liquid is supplied from the rinse liquid nozzle 40b. Then, the shutters 611 and 621 of the light projection unit 61 and the light reception unit 62 are opened to initiate the concentration detection of the chemical liquid in the rinse liquid flowing on the passing surface of the rotary ring 53, at a predetermined timing when the chemical liquid (first processing liquid) on the surface of the wafer W is replaced with the rinse liquid (second processing liquid) to a certain extent (the timing indicated as "Measurement Initiation" in FIG. 11) (FIGS. 6 and 10).

When the concentration detection is initiated after the replacement of the processing liquids has been performed to a certain extent, it is possible to suppress the contamination caused by the processing liquids attached to the lenses provided in the light projection unit 61 and the light reception unit 62, and to reduce a time for which the concentration calculation unit 604 is occupied according to the concentration detection operation of each of the processing units 16.

The rinse liquid that has been supplied to the wafer W and reached the circumferential edge of the wafer W surrounds the wafer W, and flows on the passing surface provided on the upper surface side of the rotary ring 53 rotated together with the wafer W. When the light for concentration detection is projected toward the passing surface from the light projection unit 61, the light penetrates the rinse liquid, and is reflected on the top surface of the reflection member 531 to be incident on the light reception unit 62.

In this case, the wavelength B is absorbed by the rinse liquid (second processing liquid), and the wavelength A is absorbed by the chemical liquid contained in the rinse liquid. The concentration of the chemical liquid in the rinse liquid is detected from the ratio between the absorbance of the wavelength A and the absorbance of the wavelength B.

Here, as indicated by dashed lines in FIG. 10, the position of the circumferential edge of the wafer W held on the support unit 31 may be vertically deviated by the bending of the wafer W. However, since the light projection unit 61 performs the concentration detection by projecting the light to the rinse liquid that flows on the top surface of the rotary ring 53 immediately after flowing out from the wafer W, the concentration detection may be performed without being affected by the bending of the wafer W. For example, when a concentration sensor is provided at the position where the rinse liquid is discharged from the drain port 51 of the bottom of the recovery cup 50 to detect the concentration of the chemical liquid in the rinse liquid, the rinse liquid is likely to be degenerated before it reaches the concentration sensor since the distance between the position where the rinse liquid flows out from the wafer W and the position where the concentration detection is performed is long. However, the concentration detection may be performed in the state substantially identical to that on the surface of the wafer W by performing the concentration detection on the rotary ring 53 arranged near the wafer W. Further, since the state on the top surface of the rotary ring 53 does not change even if a pattern of the wafer W changes by, for example, switching of lots, the concentration detection may be performed under the stable condition.

When the concentration of the chemical liquid in the rinse liquid becomes a predetermined threshold value or less by performing the above-described concentration detection while performing the replacement of the chemical liquid with the rinse liquid (rinse processing) (process P2 of FIG. 9), the supply of the rinse liquid from the rinse liquid nozzle 40*b* is stopped. Then, with the stop and replacement of the rinse liquid, the supply of the IPA from the IPA nozzle 40*c* is performed (process P3 of FIG. 9).

When a plurality of kinds of chemical liquids are switched and supplied, the second chemical liquid processing P12 is performed after the first chemical liquid processing P11 and the rinse processing P21 are performed. In the rinse processing P22 after the second chemical liquid processing P12, the concentration detection of the second chemical liquid in the rinse liquid is also performed according to the same method as the above-described method. In addition, the supply of the IPA is started after the concentration of the second chemical liquid becomes the predetermined threshold value or less.

Thereafter, the concentration detection of the rinse liquid (water) in the IPA that flows on the passing surface of the rotary ring 53 is initiated at a predetermined timing when the rinse liquid (first processing liquid) on the surface of the wafer W is replaced with the IPA (second processing liquid) to a certain extent (the timing indicated as "Measurement Initiation" in FIG. 11) (FIGS. 6 and 10).

Here, the absorption wavelengths of the chemical liquid, the rinse liquid, and the IPA are different from one another. Thus, combinations of wavelengths of the infrared lights for use in concentration detection are different from each other at the time of replacing the chemical liquid with the rinse liquid (process P1→process P2 in FIG. 9) and replacing the rinse liquid with the IPA (process P2→process P3 in FIG. 9). In this case, a combination obtained by mixing the infrared lights of the wavelengths that correspond to all the chemical liquid, the rinse liquid, and the IPA may be used for the concentration detection in the replacement of both liquids. Alternatively, combinations obtained by mixing infrared lights may be switched depending on a combination of the first processing liquid and the second processing liquid.

Then, while the concentration of the rinse liquid in the IPA is detected, the replacement of the rinse liquid with the IPA is performed. When the concentration of the rinse liquid in the IPA becomes the predetermined threshold value or less, the supply of the IPA from the IPA nozzle 40*c* is stopped. Thereafter, when the wafer W is continually rotated, the IPA is shaken off such that drying of the wafer W is performed (process P4 of FIG. 9).

Further, in the case of confirming water in the downflow by using the operation of the replacement with the IPA, the concentration detection of the water is continued even after the concentration of the rinse liquid (DIW) in the IPA falls below the threshold value. When the concentration of the water in the IPA does not fall below the alarm notification value represented by the dashed line even after the lapse of a predetermined timing, which is indicated as "Alarm Notification Determination" in FIG. 11, an alarm is notified from the alarm notification unit 181 as a water concentration control error of the FFU 21.

When the processings with the different kinds of the processing liquids and the drying of the wafer W are terminated, the rotation of the wafer W is stopped. Then, the wafer W is transferred to the substrate transfer device 17, which has entered the chamber 20, in the reverse order to the order when the wafer W is carried in, and the wafer W is carried out from the processing unit 16.

According to the substrate processing system 1 of the present exemplary embodiment, the following effects are achieved. The concentration of a processing liquid (a concentration of a first processing liquid in a second processing liquid) is detected by projecting light for concentration detection to the processing liquid that flows on the passing surface of the rotary ring 53 provided at the position where the processing liquid flows out from a wafer W. Therefore, the concentration detection may be performed in a state where the concentration is close to the concentration of the processing liquid on the surface of the wafer W, without being affected by a pattern formed on the wafer W or bending of the wafer W. As a result, it is possible to accurately and quickly determine whether the processing liquid on the surface of the wafer W has been replaced from the first processing liquid to the second processing liquid. Further, in an apparatus, where the concentration is detected at a position that is spaced away from the wafer W, such as, for example, the drain port 51, at the time of detecting the concentration of a liquid such as, for example, the IPA that is likely to absorb water, the IPA may absorb water in the atmosphere, so that the concentration may not be accurately detected. In the present exemplary embodiment, an effect is also achieved in which an accurate concentration may be detected before the IPA absorbs the water in the atmosphere.

It has been described that the substrate processing system 1 of the present exemplary embodiment is effective for detecting whether a processing liquid on the surface of a wafer W is replaced from a first processing liquid to a second processing liquid, but the substrate processing system 1 is not limited thereto. For example, in an etching processing, the substrate processing system 1 is also available for detecting a concentration change of a processing liquid, monitoring a method of carrying out etching, or detecting termination of etching. In a processing using a hydrofluoric acid processing liquid or a phosphoric acid processing liquid as an example of such a processing liquid, detecting a change of a silicon concentration in a processing is considered. Detecting a concentration of a metal dissolved in a processing liquid is also considered. The controller 18 performs a control of a supply amount of the processing liquid or a control of stopping supply of the processing liquid, based on a concentration detection result.

In the examples illustrated in FIGS. 3 and 4, the rotary ring 53 that guides the processing liquid flowing out from the wafer W is utilized as a processing liquid flowing portion, and light is projected to the passing surface of the processing liquid that is formed on the top surface side of the rotary ring 53 to perform the concentration detection. However, it is not essential for the processing unit 16 to include the rotary ring 53 (and the rotary cup 54) to guide the processing liquid flowing out from the wafer W.

For example, a processing liquid passing portion dedicated for concentration detection may be provided. In this case, the processing liquid passing portion may not be placed together with the wafer W on the holding unit 31. For example, the processing liquid passing portion may be fixed within the recovery cup 50 to surround the wafer W held and rotated on the holding unit 31.

Further, when the processing liquid passing portion is fixed, the processing liquid passing portion may not surround the wafer W.

Figure 12:
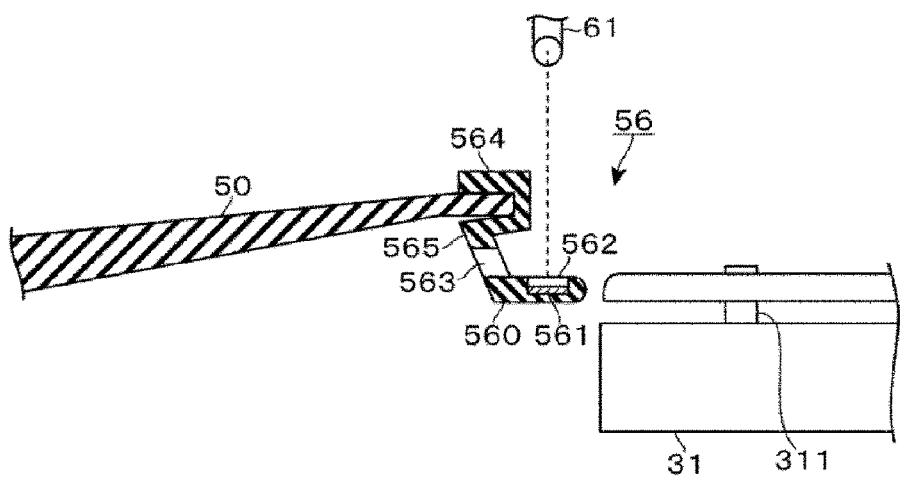
FIG. 12 is an enlarged vertical sectional side view of a processing unit according to a second exemplary embodiment.
Figure 13:
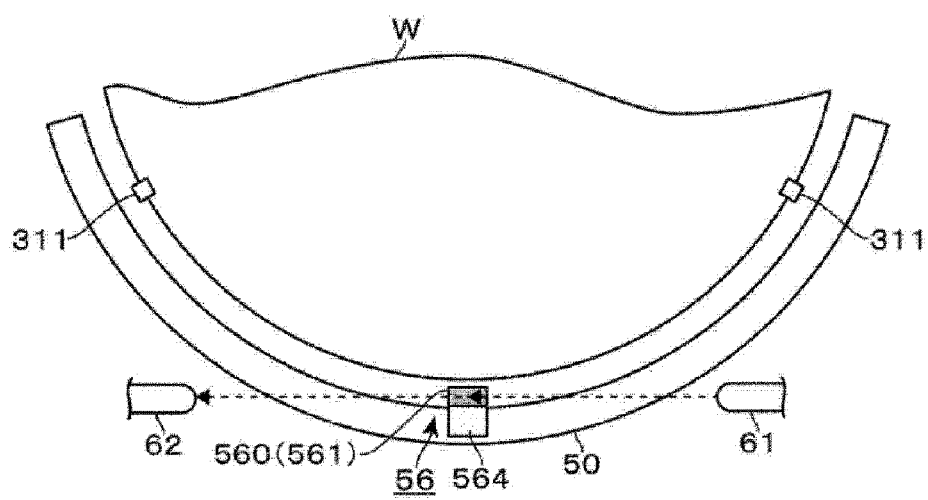
FIG. 13 is an enlarged plan view of a processing unit according to the second exemplary embodiment.

FIGS. 12 and 13 illustrate an example in which a concentration detection jig 56 is provided at an outer peripheral side of a portion of the circumferential edge of the wafer W held on the holding unit 31. The concentration detection jig 56 is provided with a passing surface having a width of several mm to several cm. The concentration detection jig 56 of the present example is provided to be attachable/detachable with respect to the inner peripheral end of the top surface of the recovery cup 50 via an attachment portion 564.

The concentration detection jig 56 attached to the recovery cup 50 via the attachment unit 564 forms the passing surface of the processing liquid with the top surface side thereof. The concentration detection jig 56 includes a flow passage forming portion 560 that is formed of a piece-shaped member and placed with a gap of about 0.5 mm to about 5 mm from the circumferential side surface of the wafer W, and a support portion 565 that suspends and supports the flow passage forming portion 560 from the attachment unit 564. The concentration detection jig 564 is the same as the rotary ring 53 according to the exemplary embodiment described above with reference to FIGS. 3 and 4, in that a reflection member 561 and a protection member 562 are provided on the top surface side of the flow passage forming portion 560 that becomes the passing surface of the processing liquid. Further, a flow passing port 563 is formed in the support unit 565 such that the processing liquid flowing on the flow passage forming portion 560 is discharged through the flow port 563.

Figure 14:
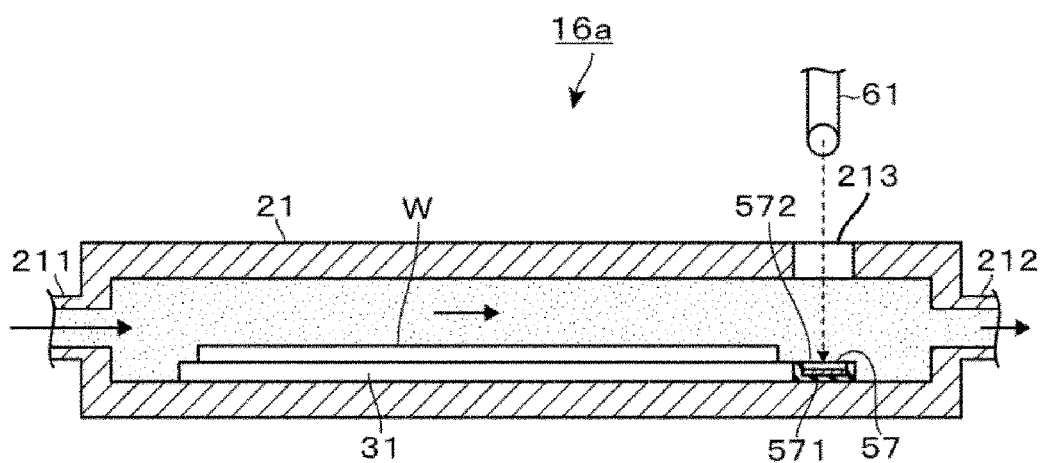
FIG. 14 is a vertical sectional side view of a processing unit according to a third exemplary embodiment.

In the exemplary embodiments illustrated in FIGS. 12 to 14, the components, which have the same functions as those in the exemplary embodiments illustrated in FIGS. 3 and 4, are denoted by the same numerals as those in FIGS. 3 and 4.

According to the concentration detection jig 56 illustrated in FIGS. 12 and 13, a part of the processing liquid flowing out from the wafer W held and rotated on the holding unit 31 flows on the passing surface of the top surface of the flow passage forming portion 560 and then is discharged from the flow port 563. While the processing liquid flows on the flow passage forming portion 560, the concentration detection of the processing liquid is performed, as in the substrate processing system 1 according to the first exemplary embodiment as described above.

The concentration detection jig 56 is configured to be attachable/detachable with respect to the recovery cup 50 (processing unit 16) in order to represent an example, in which the concentration detection of the processing liquid is performed by using a temporarily provided optical concentration detection device, instead of, for example, a method of performing the concentration detection of the processing liquid by using the optical concentration detection unit that is permanently installed in the substrate processing system 1. For example, when a test operation of the substrate processing system 1 is conducted at the time of newly setting the substrate processing system 1 in a plant, the optical concentration detection device and the concentration detection jig 56 are temporarily installed so as to obtain a profile for a concentration change of a processing liquid as exemplified in FIG. 11. As a result, the stop timing to stop the supply of the second processing liquid in the processing unit 16 may be determined. Thus, the stop timing for the stop is set to the recipe for performing each of the processings illustrated in FIG. 9. Thereafter, the temporarily installed optical concentration detection device or concentration detection jig 56 is removed from the processing unit 16, and then, the operation of the substrate processing system 1 may be conducted.

Further, in the substrate processing system 1 in which the optical concentration detection unit is permanently installed, the flow passage forming portion 560 illustrated in FIGS. 12 and 13 may be, of course, fixedly provided at a position close to a portion of the circumferential edge of the wafer W.

FIG. 14 illustrates an example of an immersion processing unit 16a that performs the processing of the wafer W by immersing a wafer W in a processing liquid supplied into the processing chamber 21, without rotating the wafer W held by the holding unit 31. In the immersion processing unit 16a, a processing liquid is switched and supplied from a supply pipe 211 that is connected to one side surface of the processing chamber 21, and the processing liquid is discharged from a drain pipe 212 that is connected to the other side surface of the processing chamber 21.

The processing liquid flowing portion 57 is placed with a gap of about 0.5 mm to about 5 mm from the circumferential side surface of the wafer W, on the bottom surface of the processing chamber 21 at the drain pipe 212 side, which is the position where the processing liquid flows out from the wafer W on the holding unit 31. The processing liquid flowing portion 57 is formed of a piece-shaped member, like the processing liquid flowing portion 57 illustrated in FIGS. 12 and 13. The reflection member 561 and the protection member 562 are provided on the top surface side of the processing liquid flowing portion 57.

A window 213 is provided on the top side of the processing chamber 21 to transmit light. The light for concentration detection is projected from the light projection unit 61 toward the processing liquid flowing in the processing chamber 21 through the window 213. The light passes through the processing chamber 21, and the light reflected on the processing liquid flowing portion 57 is received by the light reception unit 62 such that the concentration detection is performed.

In the examples described above with reference to FIGS. 8A, 8B and 11, the absorbance change of an infrared light having a wavelength absorbed to the component of each of the first processing liquid and the second processing liquid is measured, and the concentration of the first processing liquid in the second processing liquid is detected based on the measurement result. However, it is not essential to perform the concentration detection of both the first processing liquid and the second processing liquid. For example, only the infrared light of a wavelength absorbed to the component of any one of the first processing liquid and the second processing liquid may be projected, and the concentration of any one of the processing liquids may be calculated based on a degree of decrease of the first processing liquid or a degree of increase of the second processing liquid. For example, in the case where influence by a change of a film thickness is small, based on comparison to absorbance in a case where the concentration of any one of the processing liquids is 100%, the concentration of any one of the processing liquids is detected (e.g., the first processing liquid is 5%), and the remainder becomes a concentration of the other processing liquid (e.g., the second processing liquid is 95%).

A type of substrate that may be processed by using the processing unit 16 and the immersion processing unit 16a of the exemplary embodiments of the present disclosure is not limited to a semiconductor wafer. For example, the exemplary embodiments of the present disclosure may also be applied to a processing unit, which performs a liquid processing on a glass substrate for a flat panel display.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
    a substrate placing table that is configured to hold a substrate horizontally;
    a first processing liquid supply unit that is configured to supply a first processing liquid to a substrate held by the substrate placing table;
    a recovery cup that is provided around the substrate held by the substrate placing table, and configured to receive the first processing liquid after the first processing liquid is supplied to the substrate;
    a processing liquid flowing portion that includes a passing surface that is provided between the substrate held by the substrate placing table and the recovery cup such that the first processing liquid flowing out from the substrate flows on the passing surface, wherein the passing surface surrounds the substrate, and wherein a reflection member is provided on the passing surface; and
    a concentration detector that includes a light projector configured to project light for concentration detection to the reflection member of the passing surface and a light receptor configured to receive light reflected by the reflection member of the passing surface, the concentration detector being configured to detect a concentration of the first processing liquid, based on information obtained from the light receptor.

2. The substrate processing apparatus of claim 1, wherein the concentration detector includes a plurality of light projectors, a light source configured to supply light for concentration detection to the plurality of the light projectors, and a switch configured to switch the light for concentration detection supplied from the light source to each of the light projectors.

3. The substrate processing apparatus of claim 1, further comprising:
    a controller configured to perform a control to stop the supply of the first processing liquid, based on the concentration detected by the concentration detector.

4. The substrate processing apparatus of claim 1, further comprising:
    a second processing liquid supply configured to supply a second processing liquid to the substrate; and
    a controller configured to perform a control to supply the second processing liquid to the substrate from the second processing liquid supply after the first processing liquid is supplied thereto,
    wherein the controller determines whether the first processing liquid on the surface of the substrate is replaced with the second processing liquid, based on the concentration detected by the concentration detector.

5. The substrate processing apparatus of claim 4, wherein the concentration detector detects the concentration of the first processing liquid while the second processing liquid is supplied.

6. The substrate processing apparatus of claim 4, wherein the concentration detector detects the concentration of the second processing liquid while the second processing liquid is supplied.

7. The substrate processing apparatus of claim 4, wherein the concentration detector detects the concentration of the first processing liquid and the concentration of the second processing liquid while the second processing liquid is supplied.

8. The substrate processing apparatus of claim 1, further comprising:
    a drive configured to rotate the substrate placing table around a vertical axis.

9. The substrate processing apparatus of claim 8, wherein the processing liquid flowing portion is provided on the substrate placing table, and rotated together with the substrate held by the substrate placing table.

10. The substrate processing apparatus of claim 4, wherein the controller performs a control to stop the supply of the second processing liquid from the second processing liquid supply when the concentration of the first processing liquid becomes a predetermined threshold value or less.

11. The substrate processing apparatus of claim 10, wherein the controller stores a supply time of the second processing liquid when the concentration of the first processing liquid becomes the predetermined threshold value or less, and sets the stored time as a supply time of the second processing liquid when a next substrate is processed.

12. The substrate processing apparatus of claim 10, further comprising:
    an alarm configured to notify an operator when the concentration of the first processing liquid detected by the optical concentration detector is higher than a preset alarm notification value.

13. The substrate processing apparatus of claim 1, wherein at least one of the first processing liquid and the second processing liquid is corrosive of metal, and the reflection member is formed of metal and has a surface covered with a light-transmitting protection member that suppresses corrosion of the reflection member.

14. The substrate processing apparatus of claim 1, wherein the recovery cup is configured to attach the light projector and the light receptor thereto.

15. The substrate processing apparatus of claim 1, wherein the light projector and the light receptor are provided at a location higher than the substrate held by the substrate placing table.

* * * * *